US009192055B2

(12) United States Patent
Mori et al.

(10) Patent No.: US 9,192,055 B2
(45) Date of Patent: Nov. 17, 2015

(54) CONDUCTOR PATTERN FORMING METHOD

(75) Inventors: Kentaro Mori, Inuyama (JP); Daisuke Uematsu, Aichi-gun (JP); Nobuhiro Hayakawa, Chita (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 442 days.

(21) Appl. No.: 13/310,490

(22) Filed: Dec. 2, 2011

(65) Prior Publication Data

US 2012/0141662 A1 Jun. 7, 2012

(30) Foreign Application Priority Data

Dec. 3, 2010 (JP) ................................. 2010-270895
Oct. 11, 2011 (JP) ................................. 2011-224258

(51) Int. Cl.
  *H05K 3/12* (2006.01)
  *B41J 2/21* (2006.01)
  *H05K 1/16* (2006.01)
  *H05K 3/46* (2006.01)

(52) U.S. Cl.
  CPC .............. *H05K 3/125* (2013.01); *B41J 2/2132* (2013.01); *H05K 1/16* (2013.01); *H05K 3/4629* (2013.01); *H05K 2201/10151* (2013.01)

(58) Field of Classification Search
  None
  See application file for complete search history.

(56) References Cited

U.S. PATENT DOCUMENTS 5,767,874 A * 6/1998 Wen et al. ......................... 347/40
2006/0154468 A1 * 7/2006 Tanaka et al. .................. 438/613
2007/0087564 A1 * 4/2007 Speakman ..................... 438/674
2007/0095662 A1 5/2007 Suzuki
2009/0283304 A1 * 11/2009 Winoto .......................... 174/257

FOREIGN PATENT DOCUMENTS

| JP | 2003-261397 A | 9/2003 |
| JP | 2004-296142 A | 10/2004 |
| JP | 2006-035820 A | 2/2006 |
| JP | 2007-248335 A | 9/2007 |
| JP | 2008-071902 A | 3/2008 |
| JP | 2008-218850 A | 9/2008 |
| JP | 2009-212249 A | 9/2009 |
| JP | 2010-245474 A | 10/2010 |

OTHER PUBLICATIONS

Japanese Office Action issued on Aug. 14, 2013 for corresponding Japanese Patent Application No. 2011-253391.
Communication dated Jul. 31, 2014 from the State Intellectual Property Office of P.R. China in counterpart Chinese Patent Application No. 201110400075.5.

* cited by examiner

*Primary Examiner* — Timothy Meeks
*Assistant Examiner* — Michael P Rodriguez
(74) *Attorney, Agent, or Firm* — Sughrue Mion, PLLC

(57) ABSTRACT

There is provided a method for forming a conductor pattern on a substrate in such a manner that the conductor pattern has a lead portion extending in a longitudinal direction thereof, a first conductor portion located at one end of the lead portion and a second conductor portion located at the other end of the lead portion, including a printing step of printing at least the lead portion by ink-jet printing process, i.e., scanning a print head while discharging liquid ink drops from nozzles of the prink head, wherein the scanning of the print head is performed in the longitudinal direction of the conductor pattern during the printing step; and wherein the length of each of the first and second conductor portions in a direction perpendicular to the longitudinal direction of the conductor pattern is larger than the diameter of the ink drop.

7 Claims, 3 Drawing Sheets

CONDUCTOR PATTERN FORMING METHOD

BACKGROUND OF THE INVENTION

The present invention relates to a method for forming a conductor pattern.

There is conventionally known ink-jet printing process in which a given ink pattern is printed on a print object such as a print paper or a substrate by means of an ink-jet head and, more specifically, by moving the print object in one direction while moving the ink-jet head in a direction perpendicular to the moving direction of the print object as disclosed in Japanese Laid-Open Patent Publication No. 2006-35820. In this printing process, the relative moving direction of the print object and the ink-jet head, i.e., the actual direction of pattern printing on the print object is always constant regardless of the pattern orientation (horizontal orientation or vertical orientation). Further, the ink-jet head is generally configured to, while moving the print object on a stage, apply pressure pulses to a molten ink and thereby discharge minute ink drops from its nozzles (ink discharge holes) onto the print object during the printing process as disclosed in Japanese Laid-Open Patent Publication No. 2009-212249.

The above-mentioned ink-jet printing process can be adopted as various printing techniques, including not only plain-paper printing for printing an ordinary ink such as a color ink on a plain paper sheet but also conductor pattern printing for printing a conductor pattern on a circuit substrate.

SUMMARY OF THE INVENTION

In the ink-jet printing process, however, any one or some of the nozzles of the ink-jet head may be clogged depending on the state of the printing ink and the operating condition of the ink-jet head. When the ink jet printing process is adopted as the conductor pattern forming technique, there occurs a deterioration in the connection reliability of the conductor pattern or a breakage of the conductor pattern due to such nozzle clogging.

It is therefore an object of the present invention to provide a conductor pattern forming method by which a conductor can be formed with high connection reliability. It is also an object of the present invention to provide a gas sensor manufacturing method in which an electrode pattern of a gas sensor element is formed by the above conductor pattern forming method.

According to an aspect of the present invention, there is provided a method for forming a conductor pattern on a substrate, the conductor pattern having a lead portion extending in a longitudinal direction thereof, a first conductor portion located at one end of the lead portion and a second conductor portion located at the other end of the lead portion, the method comprising: a printing step of printing at least the lead portion by ink-jet printing process, the ink-jet process including scanning a print head while discharging liquid ink drops from nozzles of the prink head, wherein the scanning of the print head is performed in the longitudinal direction of the conductor pattern during the printing step; and wherein the length of each of the first and second conductor portions in a direction perpendicular to the longitudinal direction of the conductor pattern is larger than the diameter of the ink drop.

According to another aspect of the present invention, there is provided a gas sensor manufacturing method in which an electrode pattern of a gas sensor element is formed by the above conductor pattern forming method.

The other objects and features of the present invention will also become understood from the following description.

DESCRIPTION OF THE EMBODIMENTS

Figure 1:
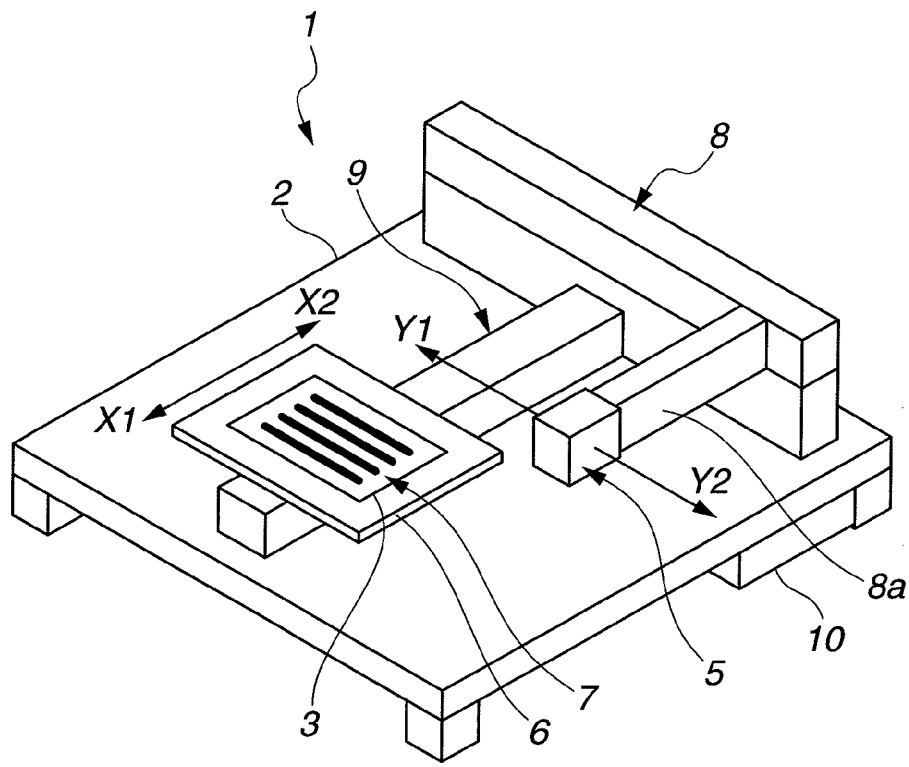
FIG. 1 is a schematic view of a conductor forming device in which the present invention can be embodied.

The present invention will be described in detail below by way of the following embodiment.

The following embodiment of the present invention refers to a conductor pattern forming method for forming a conductor pattern on a substrate in such a manner that the conductor pattern has a lead portion extending in a longitudinal direction thereof, a first conductor portion located at one end of the lead portion and a second conductor portion located at the other end of the lead portion. In the present embodiment, the conductor pattern forming method includes a printing step of printing at least the lead portion by ink-jet printing process, i.e., by scanning a print head while discharging liquid ink drops from nozzles of the print head, wherein the scanning of the print head is performed in the longitudinal direction of the conductor pattern; and wherein the length of each of the first and second conductor portions in a direction perpendicular to the longitudinal direction of the conductor pattern (hereinafter referred to as "the width of each of the first and second conductor portions") is larger than the diameter of the ink drop discharged from the nozzle of the print head.

The print head is scanned in the longitudinal direction of the conductor pattern during at least the printing of the lead portion, whereas the nozzles of the print head are generally arranged in a direction intersecting (e.g. perpendicular to) the scanning direction of the print head. Further, both of the first and second conductor portions are larger than the ink drop discharged from the print head nozzle. Even if one or some of the print head nozzles are clogged, the lead portion can be thus printed continuously with the ink drops discharged from the unclogged print head nozzles so as not to cause a breakage of the lead portion in the longitudinal direction. It is accordingly possible in the present embodiment to connect the first and second conductor portions to each other assuredly by such a continuous lead portion and improve the connection reliability of the conductor pattern on the substrate. It is also possible to shorten the printing time of the conductor pattern and form the conductor pattern efficiently as the number of scanning of the print head relative to the substrate in one direction (main scanning direction) can be substantially reduced in the present embodiment.

Herein, it is preferable that the length of the lead portion in the direction perpendicular to the longitudinal direction of the conductor pattern (hereinafter referred to as "the width of the lead portion") is also larger than the diameter of the ink drop. This makes it possible that, even if one or some of the print head nozzles are clogged, the lead portion can be printed with the ink drops discharged from the unclogged print head nozzles so as to secure assured connection of the first and second conductor portions.

It is further preferable that the width of each of the first and second conductor portions is larger than the width of the lead portion in the direction. This leads to more assured connection of the first and second conductor portions as the lead portion can be printed with the ink drops discharged from the unclogged print head nozzles even if one or some of the print head nozzles are clogged.

In the printing step, the relative position of the substrate and the print head is changed in the longitudinal direction of the conductor pattern so that the printing of the conductor pattern (i.e. the scanning of the printing head) is performed in the longitudinal direction of the conductor pattern. It is feasible to change the relative position of the print head and the substrate in the longitudinal direction of the conductor pattern by moving the print head relative to the substrate in the longitudinal direction or by moving the substrate relative to the print head in the longitudinal direction. This makes it possible to secure the flexibility of the printing step.

The conductor pattern forming method can suitably be applied as a gas sensor manufacturing method so as to form an electrode pattern on a solid electrolyte substrate for use in a gas sensor element.

The thus-formed electrode pattern has an electrode lead portion extending in a longitudinal direction thereof to define an electric signal transmission path, an electrode portion located at one end of the electrode lead portion and a conductor portion located at the other end of the electrode lead portion. As mentioned above, the electrode lead portion is printed by scanning the print head in the longitudinal direction of the electrode pattern; and the width of each of the electrode portion and the conductor portion are larger than the diameter of the ink drop discharged from the print head nozzle. Even if one or some of the print head nozzles are clogged, the electrode lead portion can be printed with the ink drops discharged from the unclogged print head nozzles so as not to cause a breakage of the electrode lead portion in the longitudinal direction. It is thus possible to connect the electrode portion and the conductor portion to each other by the electrode lead portion and improve the connection reliability of the electrode pattern. Even in this case, the width of the electrode lead portion is also preferably larger than the diameter of the ink drop discharged from the print head nozzle in order to secure assured connection of the electrode portion and the conductor portion. Further, the width of each of the electrode portion and the conductor portion is preferably large than or equal to the width of the electrode lead portion in order to secure more assured connection of the electrode portion and the conductor portion and thereby ensure improvements in the connection reliability and productivity of the gas sensor element.

The electrode pattern is applicable in various forms as long as the electrode pattern is arranged on a surface of the solid electrolyte substrate of the gas sensor. For example, the electrode pattern can be used in such a manner that, when the gas sensor element is provided with a plurality of solid electrolyte substrates, the conductor portion is arranged on a surface of the outermost solid electrolyte substrate so as to serve as an electrode pad for connection to the electrode portion via the electrode lead portion. The electrode pattern can also be used in such a manner that the conductor portion is arranged in a through hole of the solid electrolyte substrate so as to serve as a through hole conductor for connection of an electrode pad of the gas sensor element to the electrode lead portion.

In the conductor pattern forming method, the ink-jet printing process can be conducted by a printing device as shown in FIG. 1. The printing device 1 is herein configured to form a plurality of conductor patterns 7 on a substrate 3 by ink-jet printing and is equipped with a base plate 2, a print head (ink-jet head) 5, a stage 6, a head moving mechanism 8, a stage moving mechanism 9 and a control unit 10. In the present embodiment, the substrate 3 consists of a plurality of rectangular substrate units (e.g. 48 substrate units) on which the conductor patterns 7 are formed, respectively. These substrate units are arranged in the same orientation. The substrate 3 is formed in one piece and finally divided into the separate substrate units.

The print head 5 has a plurality of nozzles (e.g. 128 nozzles) and a piezoelectric element as a drive element so as to discharge liquid drops of printing ink through the nozzles by the application of pressure to the piezoelectric element. The nozzles are arranged in parallel at a given pitch (e.g. 508 µm) along a direction intersecting a main scanning direction Y1-Y2 of the print head 5. Further, the print head 5 has the head angle adjusting function to adjust the angle of the print head 5 relative to the main scanning direction Y1-Y2 and thereby change the dot pitch (resolution) of the conductor pattern 7. (When the head angle adjusting function is not actuated, the nozzles are aligned along a sub-scanning direction X1-X2 perpendicular to the main scanning direction Y1-Y2.)

There is no particular limitation on the printing ink. For example, the printing ink can be prepared by mixing a conductive material such as metal or metal oxide, a binder, a dispersant etc. with a solvent such as butyl carbitol acetate. Examples of the metal usable as the conductive material are gold, silver, copper and platinum. Examples of the metal oxide usable as the conductive material are zirconia and alumina. The conductive material is not however limited to these metals and metal oxides.

The head moving mechanism 8 includes a drive motor (as a power source), a ball screw driven by the drive motor and an arm 8a having a base end engaged with the ball screw and a distal end supporting the print head 5 so as to move the print head 5 in the main scanning direction Y1-Y2.

The stage 6 supports thereon the substrate 3 in such a manner that the longitudinal sides of the substrate units are aligned in the main scanning direction Y1-Y2 of the print head 5 (the longitudinal direction of the conductor pattern 7 to be formed on the substrate 3 is in agreement with the main scanning direction of the print head 5).

The stage moving mechanism 9 holds thereon the stage 6 and includes a drive motor (as a power source) and a ball screw driven by the drive motor so as to move the stage 6 in the sub-scanning direction X1-X2 with the substrate 3 supported on the stage 6.

The substrate 3 and the print head 5 are shifted in position relative to each other in the longitudinal direction of the conductor pattern 7 (the main scanning direction of the print head 5) by the head moving mechanism 8 and the stage moving mechanism 9.

The control unit 10 generates various control signals (voltage signals), including an actuation signal to enable the print head 5 (the piezoelectric element) to discharge the conductor printing ink through the nozzles, a drive signal to enable the head moving mechanism 8 (the drive motor) to move the print head 5 in the main scanning direction Y1-Y2 and a drive signal to enable the stage moving mechanism 9 (the drive motor) to move the stage 6 in the sub-scanning direction X1-X2.

The ink-jet printing is thus carried out by the print head 5, the head moving mechanism 8 and the stage moving mechanism 9 under the control signals from the control unit 10.

Figure 2:
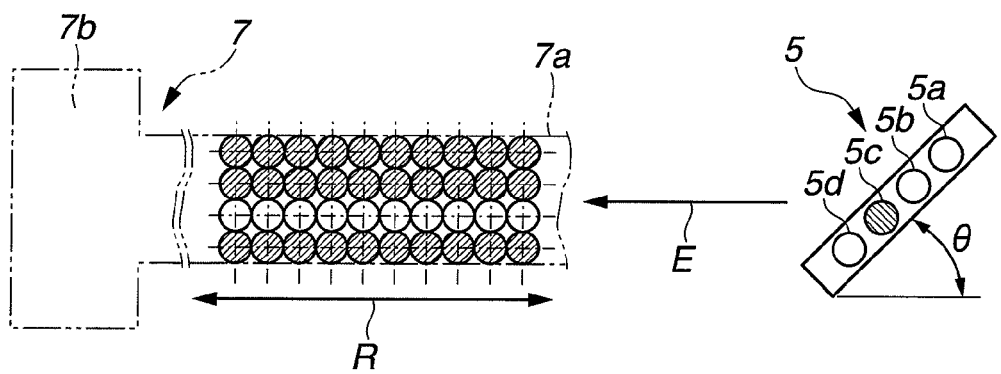
FIG. 2 is a schematic view showing a conductor pattern forming method according to one embodiment of the present invention.

The conductor forming method of the present embodiment will be explained in more detail below by taking, as one example, the case where the conductor pattern 7 is printed by the printing device 1, with the print head 5 inclined at an angle θ relative to the main scanning direction Y1-Y2, in such a manner that the conductor pattern 7 has a lead portion 7a extending from one side to the other side thereof in its longitudinal direction to define an electric signal transmission path and first and second conductor portions 7b and 7c formed at opposite ends of the lead portion 7a for signal input/output as shown in FIG. 2. Herein, FIG. 2 is illustrated schematically by reducing the number of nozzles in the print head 5 and by simplifying the ink-jet printing process so as to complete the printing of the conductor pattern 7 in one scanning operation for the purposes of clarifying the technical features of the conductor pattern forming method of the present embodiment.

It is assumed that one of four print head nozzles 5a to 5d of the print head 5, i.e., nozzle 5c is clogged so that the liquid printing ink is not discharged from the nozzle 5c and is discharged only from the nozzles 5a, 5b and 5d.

Figure 3:
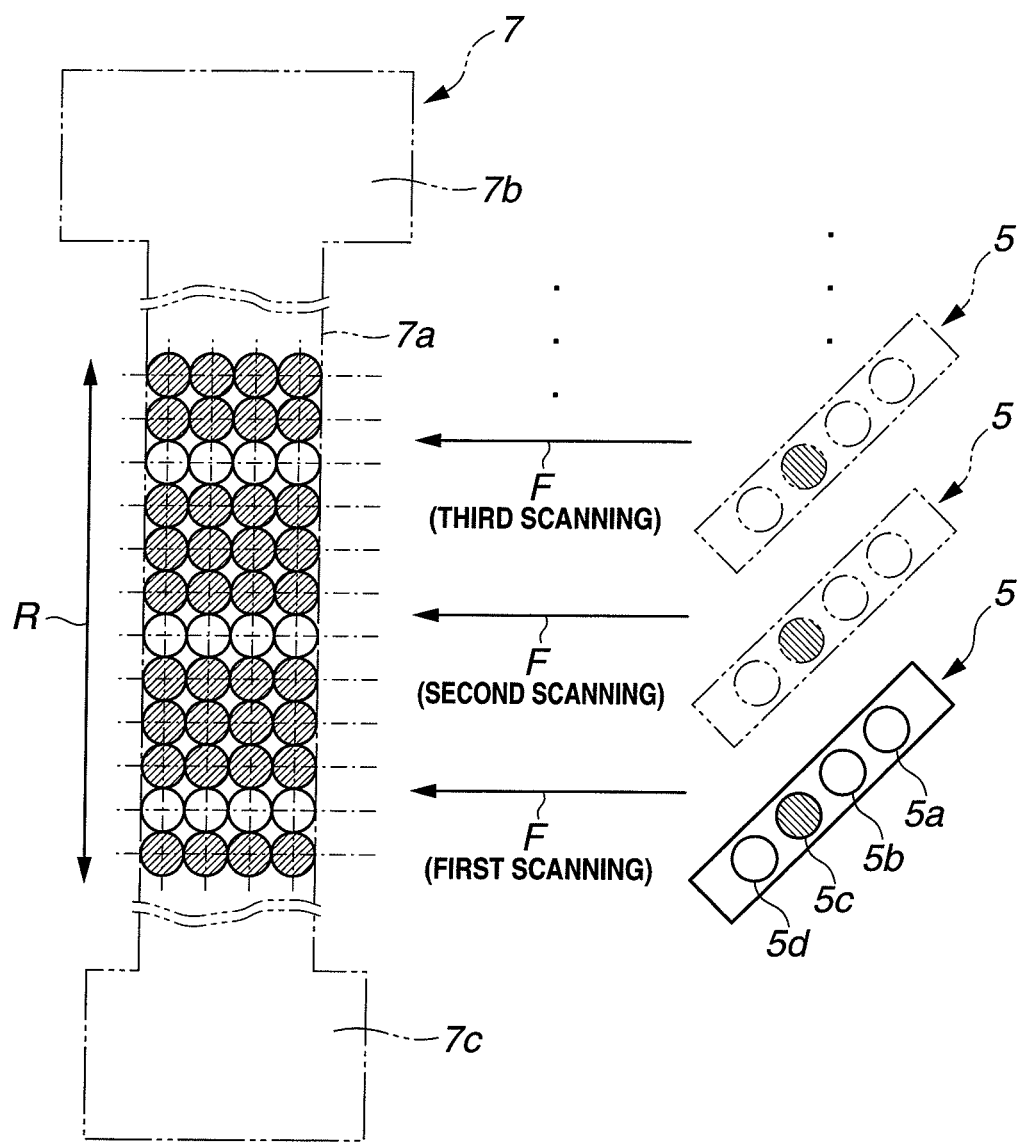
FIG. 3 is a schematic view showing a conventional conductor pattern forming method.

In a conventional conductor pattern forming method, the substrate 3 is set on the stage 6 in such a manner that the longitudinal direction R of the conductor pattern 7 to be formed on the substrate 3 is in agreement the sub-scanning direction X1-X2 of the print head 5. The printing of the conductor pattern 7 is thus performed in a direction F intersecting (perpendicular to) the longitudinal direction R of the conductor pattern 7. As a result, some areas in which ink drops cannot be printed due to the clogging of the nozzle 5c occur along the direction F perpendicular to the longitudinal direction R of the conductor pattern 7 as shown in FIG. 3. This causes a breakage of the lead portion 7a (signal transmission path) of the conductor pattern 7. In order to avoid such a lead breakage, it is necessary in the conventional conductor pattern forming method to repeat a plurality of scanning operations by moving the print head 5 repeatedly (at a plurality of times) in the direction F.

In the present embodiment, by contrast, the substrate 3 is set in such a manner that the longitudinal direction R of conductor pattern 7 to be formed on the substrate 3 is in agreement with the main scanning direction Y1-Y2 of the print head 5 as mentioned above. The printing of the conductor pattern 7 is thus performed in a direction E along the longitudinal direction R of the conductor pattern 7 as shown in FIG. 2. Even an area in which ink drops cannot be printed due to the clogging of the nozzle 5c occurs in the direction E along the longitudinal direction R of the conductor pattern 7, the lead portion 7a (signal transmission path) can be printed continuously with the ink drops discharged from the unclogged nozzles 5a, 5b and 5c. It is thus possible to substantially prevent the occurrence of a breakage of the lead portion 7a and improve the connection reliability of the conductor pattern 7. It is also possible to shorten the printing time of the conductor pattern 7 and form the conductor pattern 7 efficiently as the number of scanning of the print head 5 relative to the substrate 3 in one direction (main scanning direction) can be reduced.

The thus-formed conductor pattern has a multitude of uses.

Figure 4:
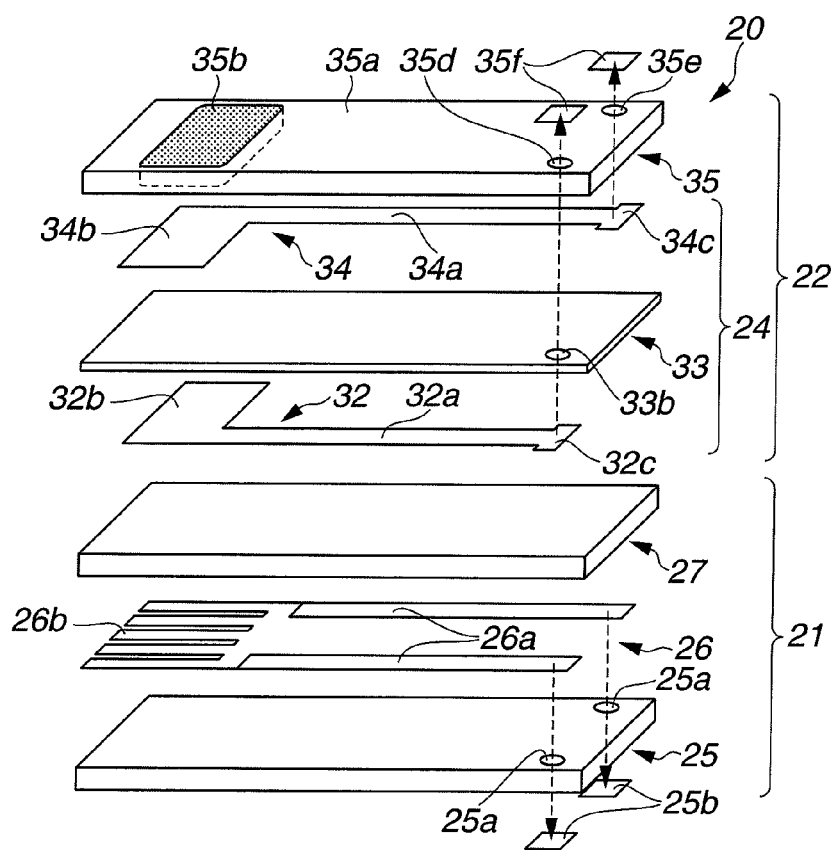
FIG. 4 is an exploded perspective view of a gas sensor in which an electrode pattern is formed on a substrate by the conductor pattern forming method of FIG. 2.

For example, the conductor pattern is applicable to a gas sensor element 20 as shown in FIG. 4 and as mentioned above. The gas sensor element 20 has a sensor body 22 and a heater 21 laminated together.

The heater 21 includes a pair of first and second rectangular substrate members 27 and 25 and a heating resistor 26.

The first and second rectangular substrate members 27 and 25 are formed predominantly of a sintered ceramic material such as aluminum oxide (alumina).

The heating resistor 26 is formed predominantly of platinum or tungsten etc. and is arranged between the first and second substrate members 27 and 25. As shown in FIG. 4, the heating resistor 26 has a winding-shaped heating portion 26b capable of generating heat upon energization thereof and a pair of heater lead portions 26a connected at respective one ends thereof to the heating portion 26b and extending along a longitudinal direction of the substrate member 25, 27.

A pair of heater energization terminals 25b are arranged on the second substrate member 25 and connected to external terminals for connection to an external circuit. Further, two through holes 25a are formed in the second substrate member 25 for connection of the other ends of the heater lead portions 26a to the heater energization elements 25b, respectively.

On the other hand, the sensor body 22 includes an oxygen concentration detection cell (cell layer) 24 and a protection layer 35.

The oxygen concentration detection cell 24 has a rectangular solid electrolyte substrate 33 and first and second electrode patterns 32 and 34 arranged on opposite main surfaces of the solid electrolyte substrate 33.

The solid electrolyte substrate 33 is of a solid electrolyte material for an oxygen concentration cell. A through hole 33b is formed in the solid electrolyte substrate 33.

In the present embodiment, each of the first and second electrode patterns 32 and 34 is formed by the above-mentioned conductor pattern forming method.

More specifically, the first electrode pattern 32 has a first electrode portion 32b, a first electrode lead portion 32a and a first conductor portion; and the second electrode pattern 34 has a second electrode portion 34b, a second electrode lead portion 34a and a second conductor portion 34c as shown in FIG. 4. The first and second electrode portions 32b and 34b face each other via the solid electrolyte substrate 33 so that the electrode portions 32b and 34b constitute a sensing section in combination with the solid electrolyte substrate 33. The first lead portion 32a extends between the first electrode portion 32b and the first conductor portion 32c in the longitudinal direction of the first electrode pattern 32, whereas the second electrode lead portion 34a extends between the second electrode portion 34b and the second conductor portion 34c in the longitudinal direction of the second electrode pattern 34.

The protection layer 35 is laminated on a surface of the second electrode pattern 34 opposite to the solid electrolyte substrate so as to sandwich the second electrode pattern 34 between the solid electrolyte substrate 33 and the protection layer 35. As shown in FIG. 4, the protection layer 35 has a porous electrode protection layer 35b for protecting the second electrode portion 34b from poisoning and a reinforcement protection layer 35a for protecting the solid electrolyte substrate 33 in the present embodiment. Through holes 35d and 35e are formed in the protection layer 35.

Further, signal output terminals 35f are provided on the protection layer 35. One of the signal output terminals 35f is connected to the first conductor portion 32c of the first electrode pattern 32 via the through hole 33b of the solid electrolyte substrate 33 and the through hole 35d of the protection layer 35. The other of the signal output terminals 35 is connected to the second conductor portion 34c of the second electrode pattern 34 via the through hole 35e of the protection layer 35.

In the present embodiment, the electrode portion 32b, 34b of the electrode pattern 32, 34 has a width of about 3.0 mm; the electrode lead portion 32a, 34a of the electrode pattern 32, 34 has a length of about 30 mm and a width of about 0.5 mm; and the conductor portion 32c, 34c of the electrode pattern 32, 34 has a width of about 1.0 mm. Herein, the "length" refers to the length of the electrode lead portion 32a, 34a, the electrode portion 32b, 34b or the conductor portion 32c, 34c in the longitudinal direction of the electrode pattern 32, 34; and the "width" refers the length of the electrode lead portion 32a, 34a, the electrode portion 32b, 34b or the conductor portion 32c, 34c in the direction perpendicular to the longitudinal direction of the electrode pattern 32, 34. The diameter of the ink drop discharged from the print head nozzle is about 100 μm. Namely, the width of the electrode lead portion 32a, 34a is smaller than or equal to the width of the electrode portion 32b, 34b and the conductor portion 32c, 34c and is larger than the diameter of the ink drop.

The above-configured gas sensor element 20 is suitably used in e.g. an air-fuel ratio sensor to detect the concentration of oxygen by the concentration cell action of the oxygen concentration detection cell 24.

As the electrode pattern 32, 34 of the gas sensor element 20 (oxygen concentration detection cell 24) are formed by the above-mentioned conductor pattern forming method, the electrode lead portion 32a, 34a can be printed continuously with no breakage so as to ensure assured connection of the electrode portion 32b, 34b and the conductor portion 32c, 34c even when either one or some of the print head nozzles are clogged. It is thus possible to improve the internal connection reliability and productivity of the gas sensor element 20.

EXAMPLES

The present invention will be described in more detail below by way of the following examples.

Figure 5:
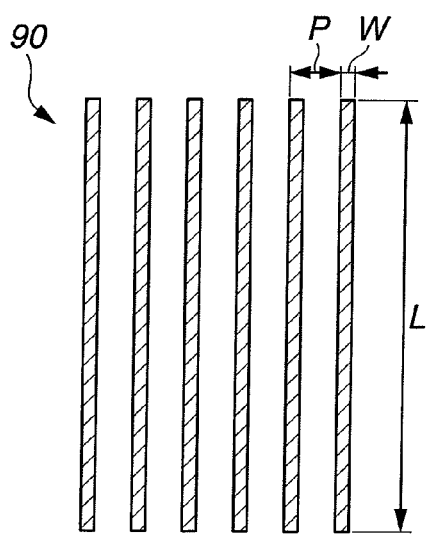
FIG. 5 is a plan view of a conductor pattern formed in Examples and Comparative Examples.

In each of Examples 1 and 2 and Comparative Examples 1 and 2, a conductor pattern 90 was formed by ink jet printing on a substrate as shown in FIG. 5. Herein, the conductor pattern 90 had six pattern lines arranged in parallel at a given pitch P and each having a length L of 50 mm and a width W of 1 mm. The ink-jet printing was performed by means of the printing device 1 of FIG. 1 where the print head (ink-jet head) had 10 nozzles arranged at a pitch of 508 μm. Further, there was used a liquid printing ink containing 66 mass % of butyl carbitol acetate as a solvent, 28 mass % of platinum as a metal, 4 mass % of zirconia as a metal oxide, 1 mass % of a binder and 1 mass % of a dispersant etc.

In Examples 1 and 2, the ink-jet printing was performed in a direction E along the longitudinal direction of the conductor pattern 90 (7) as shown in FIG. 2. In Comparative Examples 1 and 2, the ink-jet printing was performed in a direction F perpendicular to the longitudinal direction of the conductor pattern 90 (7) as shown in FIG. 3. During the ink-jet printing, the print head was inclined at an angle θ relative to the main scanning direction Y1-Y2 so as to control the dot pitch (resolution) of the conductor pattern 90 to 100 μm (254 dpi) in Example 1 and Comparative 1 and to control the dot pitch (resolution) of the conductor pattern 90 to 50 μm (508 dpi) in Example 2 and Comparative Example 2.

The printing results are indicated in TABLE 1.

TABLE 1

| | Print head | Dot pitch (Resolution) | Print head scanning direction | Printing time |
|---|---|---|---|---|
| Example 1 | Nozzle number: 10 | 100 μm (254 dpi) | Direction E | 53 sec |
| Comparative Example 1 | Nozzle pitch: 508 μm | 100 μm (254 dpi) | Direction F | 128 sec |
| Example 2 | | 50 μm (508 dpi) | Direction E | 81 sec |

TABLE 1-continued

| | Print head | Dot pitch (Resolution) | Print head scanning direction | Printing time |
|---|---|---|---|---|
| Comparative Example 2 | | 50 μm (508 dpi) | Direction F | 249 sec |

Direction E: along the longitudinal direction of the conductor pattern
Direction F: perpendicular to the longitudinal direction of the conductor pattern In Comparative Examples 1 and 2, the pattern printing was performed in the direction F perpendicular to the longitudinal direction of the conductor pattern 90. It was necessary in Comparative Examples 1 and 2 to scan the print head over a plurality of times in the direction F during the pattern printing. In Examples 1 and 2, by contrast, the pattern printing was performed in the direction E along the longitudinal direction of the conductor pattern 90. It was possible in Examples 1 and 2 to substantially reduce the number of scanning of the print head in the direction E (main scanning direction) and shorten the printing time of the conductor pattern 90. As a result, the printing time of Examples 1 and 2 was shorter than that of Comparative Example 1 and 2 (the printing time of Example 1, 2 was shorter than half of the printing time of the corresponding Comparative Example 1, 2) as shown in TABLE 1. Furthermore, there occurred no breakage of the conductor pattern 90 in each of Examples 1 and 2.

The entire contents of Japanese Patent Application No. 2010-270895 (filed on Dec. 3, 2010) and No. 2011-224258 (filed on Oct. 11, 2011) are herein incorporated by reference.

Although the present invention has been described with reference to the above specific embodiment of the invention, the present invention is not limited to this exemplary embodiment. Various modification and variation of the embodiment described above will occur to those skilled in the art in light of the above teachings.

The present invention can be used for various applications, including not only the formation of an electrode pattern on a cell substrate in a gas sensor element as mentioned above but also the formation of a conductor pattern in a semiconductor device.

There is no particular limitation on the shape of the conductor portion of the conductor pattern formed by the conductor pattern forming method according to the present invention. Although the rectangular conductor portion 7b, 7c is formed in the above embodiments, the conductor portion can be formed in any other shape such as oval shape.

The scope of the invention is defined with reference to the following claims.

What is claimed is:

1. A method for forming a conductor pattern on a substrate, the conductor pattern having a lead portion extending in a longitudinal direction thereof, a first conductor portion located at one end of the lead portion and a second conductor portion located at the other end of the lead portion, the method comprising:
a printing step of printing at least the lead portion by ink-jet printing process,
wherein the ink-jet printing process includes a scanning operation of scanning a print head from the first conductor portion to the second conductor portion in the longitudinal direction of the conductor pattern, with a plurality of nozzles of the print head being arranged in a direction intersecting the longitudinal direction of the conductor pattern, while discharging liquid ink drops from the respective nozzles of the print head, so as to print at least the lead portion in one scanning operation;

wherein a length of the lead portion in a direction perpendicular to the longitudinal direction of the conductor pattern is larger than a diameter of each of the liquid ink drops;

wherein a plurality of the liquid ink drops are arranged in a row in the direction perpendicular to the longitudinal direction of the conductor pattern so that the lead portion is formed by combining adjacent ones of a plurality of the rows of the plurality of the liquid ink drops; and wherein a length of each of the first and second conductor portions in the direction perpendicular to the longitudinal direction of the conductor pattern is larger than the diameter of the liquid ink drops and the length of the lead portion.

2. The method according to claim 1, wherein, in the printing step, the print head is scanned by changing the relative position of the print head and the substrate in the longitudinal direction of the conductor pattern.

3. The method according to claim 1, further comprising: a setting step of setting the substrate in such a manner that the longitudinal direction of the conductor pattern to be formed on the substrate is in agreement of the direction of scanning of the print head.

4. The method according to claim 1, wherein the length of each of the first and second conductor portions in the direction perpendicular to the longitudinal direction of the conductor pattern is larger than or equal to the length of the lead portion in the direction perpendicular to the longitudinal direction of the conductor pattern.

5. A method for manufacturing a gas sensor element, the gas sensor element comprising a solid electrolyte substrate and an electrode pattern formed on the solid electrolyte substrate and having a lead portion extending in a longitudinal direction thereof, an electrode portion located at one end of the lead portion and a conductor portion located at the other end of the lead portion, the method comprising:

a printing step for printing at least the lead portion by ink-jet printing process, the ink-jet printing process includes a scanning operation of scanning a print head from the electrode portion to the lead portion, or from the lead portion to the electrode portion in the longitudinal direction of the conductor pattern, with a plurality of nozzles of the print head being arranged in a direction intersecting the longitudinal direction of the conductor pattern, while discharging liquid ink drops from the respective nozzles of the print head, so as to print at least the lead portion in one scanning operation;

wherein a length of the lead portion in a direction perpendicular to the longitudinal direction of the conductor pattern is larger than a diameter of each of the liquid ink drops;

wherein a plurality of the liquid ink drops are arranged in a row in the direction perpendicular to the longitudinal direction of the conductor pattern so that the lead portion is formed by combining adjacent ones of a plurality of the rows of the plurality of the liquid ink drops; and wherein a length of each of the electrode portion and the conductor portion in the direction perpendicular to the longitudinal direction of the electrode pattern is larger than the diameter of the liquid ink drops and the length of the lead portion.

6. The method according to claim 5, wherein the length of each of the electrode portion and the conductor portion in the direction perpendicular to the longitudinal direction of the electrode pattern is larger than the length of the lead portion in the direction perpendicular to the longitudinal direction of the electrode pattern.

7. The method according to claim 5, wherein the conductor portion serves as an electrode pad of the gas sensor element or serves as a through hole conductor for connection of an electrode pad of the gas sensor element to the lead portion.

* * * * *